(12) United States Patent
Haba et al.

(10) Patent No.: US 12,080,672 B2
(45) Date of Patent: Sep. 3, 2024

(54) DIRECT GANG BONDING METHODS INCLUDING DIRECTLY BONDING FIRST ELEMENT TO SECOND ELEMENT TO FORM BONDED STRUCTURE WITHOUT ADHESIVE

(71) Applicant: ADEIA SEMICONDUCTOR BONDING TECHNOLOGIES INC., San Jose, CA (US)

(72) Inventors: Belgacem Haba, Saratoga, CA (US); Laura Wills Mirkarimi, Sunol, CA (US); Javier A. DeLaCruz, San Jose, CA (US); Rajesh Katkar, Milpitas, CA (US); Cyprian Emeka Uzoh, San Jose, CA (US); Guilian Gao, San Jose, CA (US); Thomas Workman, San Jose, CA (US)

(73) Assignee: ADEIA Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 16/874,527

(22) Filed: May 14, 2020

(65) Prior Publication Data
US 2021/0098412 A1 Apr. 1, 2021

Related U.S. Application Data

(60) Provisional application No. 62/906,608, filed on Sep. 26, 2019.

(51) Int. Cl.
*H01L 23/00* (2006.01)
*H01L 23/31* (2006.01)

(52) U.S. Cl.
CPC .......... *H01L 24/32* (2013.01); *H01L 23/3107* (2013.01); *H01L 24/27* (2013.01);
(Continued)

(58) Field of Classification Search
CPC ......... H01L 24/27; H01L 24/29; H01L 24/32; H01L 24/83; H01L 23/3107;
(Continued)

(56) References Cited

U.S. PATENT DOCUMENTS

| 4,998,665 A | 3/1991 | Hayashi |
| 5,019,673 A | 5/1991 | Juskey et al. |

(Continued)

FOREIGN PATENT DOCUMENTS

| CN | 103681646 | 3/2014 |
| CN | 107527885 | 12/2017 |

(Continued)

OTHER PUBLICATIONS

Frumusanu, Andrei, "TSMC's version of EMIB is 'LSI': Currently in pre-qualification," AnaandTech, https://www.anandtech.com/show/16031/tsmcs-version-of-emib-lsi-3dfabric, Aug. 25, 2020, 6 pages.

(Continued)

*Primary Examiner* — Khiem D Nguyen
(74) *Attorney, Agent, or Firm* — Knobbe, Martens, Olson & Bear, LLP

(57) ABSTRACT

A bonded structure can comprise a first element and a second element. The first element has a first dielectric layer including a first bonding surface and at least one first side surface of the first element. The second element has a second dielectric layer including a second bonding surface and at least one second side surface of the second element. The second bonding surface of the second element is directly bonded to the first bonding surface of the first element without an adhesive.

28 Claims, 14 Drawing Sheets

(52) U.S. Cl.
CPC .............. *H01L 24/29* (2013.01); *H01L 24/83* (2013.01); *H01L 2224/29187* (2013.01); *H01L 2224/32145* (2013.01); *H01L 2224/32225* (2013.01); *H01L 2224/83005* (2013.01); *H01L 2224/83896* (2013.01)

(58) Field of Classification Search
CPC ....... H01L 23/3185; H01L 2224/83896; H01L 21/6835; H01L 25/0657; H01L 25/06541; H01L 25/06513; H01L 2224/32225; H01L 2224/29187; H01L 2224/32145; H01L 2224/83005; H01L 2225/06541; H01L 24/08; H01L 24/2732; H01L 24/80; H01L 2224/08145; H01L 2224/80006; H01L 24/96; H01L 2224/80906; H01L 2224/80896; H01L 2224/80895
USPC ................................ 257/757, 787; 438/112
See application file for complete search history.

(56) References Cited

U.S. PATENT DOCUMENTS

| | | |
|---|---|---|
| 5,087,585 A | 2/1992 | Hayashi |
| 5,322,593 A | 6/1994 | Hasegawa et al. |
| 5,753,536 A | 5/1998 | Sugiyama et al. |
| 5,771,555 A | 6/1998 | Eda et al. |
| 5,956,605 A | 9/1999 | Akram et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,121,688 A | 9/2000 | Akagawa |
| 6,265,775 B1 | 7/2001 | Seyyedy |
| 6,374,770 B1 | 4/2002 | Lee |
| 6,423,640 B1 | 7/2002 | Lee et al. |
| 6,465,892 B1 | 10/2002 | Suga |
| 6,582,991 B1 | 6/2003 | Maeda et al. |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,126,212 B2 | 10/2006 | Enquist et al. |
| 7,193,423 B1 | 3/2007 | Dalton et al. |
| 7,262,492 B2 | 8/2007 | Pieda et al. |
| 7,354,798 B2 | 4/2008 | Pogge et al. |
| 7,750,488 B2 | 7/2010 | Patti et al. |
| 7,781,309 B2 * | 8/2010 | Morita ................ H01L 21/2007 438/455 |
| 7,790,578 B2 | 9/2010 | Furui |
| 7,803,693 B2 | 9/2010 | Trezza |
| 7,843,052 B1 | 11/2010 | Yoo et al. |
| 7,932,616 B2 | 4/2011 | Meguro |
| 8,026,181 B2 | 9/2011 | Arita et al. |
| 8,178,963 B2 | 5/2012 | Yang |
| 8,178,964 B2 | 5/2012 | Yang |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,513,088 B2 | 8/2013 | Yoshimura et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 * | 4/2014 | Sadaka ............... H01L 23/3178 438/108 |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,975,163 B1 | 3/2015 | Lei et al. |
| 8,988,299 B2 | 3/2015 | Kam et al. |
| 9,059,010 B2 | 6/2015 | Yoshida et al. |
| 9,076,860 B1 | 7/2015 | Lei et al. |
| 9,076,929 B2 | 7/2015 | Katsuno et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,343,433 B2 | 5/2016 | Lee et al. |
| 9,355,997 B2 | 5/2016 | Katkar et al. |
| 9,368,866 B2 | 6/2016 | Yu |
| 9,385,024 B2 | 7/2016 | Tong et al. |
| 9,394,161 B2 | 7/2016 | Cheng et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,466,586 B1 | 10/2016 | Choi et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,570,421 B2 | 2/2017 | Wu et al. |
| 9,620,481 B2 | 4/2017 | Edelstein et al. |
| 9,653,433 B2 | 5/2017 | Yu et al. |
| 9,656,852 B2 | 5/2017 | Cheng et al. |
| 9,673,096 B2 | 6/2017 | Hirschler et al. |
| 9,674,939 B2 | 6/2017 | Scannell |
| 9,722,098 B1 | 8/2017 | Chung et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,818,729 B1 | 11/2017 | Chiu et al. |
| 9,852,988 B2 | 12/2017 | Enquist et al. |
| 9,865,567 B1 | 1/2018 | Chaware et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,008,844 B2 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,333,623 B1 * | 6/2019 | Liao .................... G02B 6/4283 |
| 10,410,976 B2 | 9/2019 | Asano et al. |
| 10,418,277 B2 | 9/2019 | Cheng et al. |
| 10,446,456 B2 | 10/2019 | Shen et al. |
| 10,510,629 B2 | 12/2019 | Chen et al. |
| 10,707,087 B2 | 7/2020 | Uzoh et al. |
| 10,707,145 B2 | 7/2020 | Bultitude et al. |
| 10,727,204 B2 | 7/2020 | Agarwal et al. |
| 10,727,219 B2 | 7/2020 | Uzoh et al. |
| 10,770,430 B1 | 9/2020 | Kim et al. |
| 10,790,262 B2 | 9/2020 | Uzoh et al. |
| 10,840,135 B2 | 11/2020 | Uzoh |
| 10,854,578 B2 | 12/2020 | Morein |
| 10,879,212 B2 | 12/2020 | Uzoh et al. |
| 10,879,226 B2 | 12/2020 | Uzoh et al. |
| 10,886,177 B2 | 1/2021 | DeLaCruz et al. |
| 10,892,246 B2 | 1/2021 | Uzoh |
| 10,923,413 B2 | 2/2021 | DeLaCruz |
| 10,950,547 B2 | 3/2021 | Mohammed et al. |
| 10,964,664 B2 | 3/2021 | Mandalapu et al. |

(56) References Cited

U.S. PATENT DOCUMENTS

| | | |
|---|---|---|
| 10,985,133 B2 | 4/2021 | Uzoh |
| 10,991,804 B2 | 4/2021 | DeLaCruz et al. |
| 10,998,292 B2 | 5/2021 | Lee et al. |
| 11,011,503 B2 | 5/2021 | Wang et al. |
| 11,031,285 B2 | 6/2021 | Katkar et al. |
| 11,056,348 B2 | 7/2021 | Theil |
| 11,056,390 B2 | 7/2021 | Uzoh et al. |
| 11,088,099 B2 | 8/2021 | Katkar et al. |
| 11,127,738 B2 | 9/2021 | DeLaCruz et al. |
| 11,145,623 B2 | 10/2021 | Hsu et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,658,173 B2 | 5/2023 | Uzoh et al. |
| 2002/0000328 A1 | 1/2002 | Motomura et al. |
| 2002/0003307 A1 | 1/2002 | Suga |
| 2002/0004288 A1 | 1/2002 | Nishiyama |
| 2003/0148591 A1 | 8/2003 | Guo et al. |
| 2004/0084414 A1 | 5/2004 | Sakai et al. |
| 2004/0140546 A1 | 7/2004 | Lee et al. |
| 2004/0188501 A1 | 9/2004 | Tolchinsky et al. |
| 2004/0238927 A1 | 12/2004 | Miyazawa |
| 2005/0040530 A1 | 2/2005 | Shi |
| 2005/0153522 A1 | 7/2005 | Hwang et al. |
| 2005/0161808 A1 | 7/2005 | Anderson |
| 2006/0057945 A1 | 3/2006 | Hsu et al. |
| 2006/0234473 A1* | 10/2006 | Wong ............... H01L 25/0657 |
| | | 438/455 |
| 2007/0007639 A1 | 1/2007 | Fukazawa et al. |
| 2007/0096294 A1 | 5/2007 | Ikeda et al. |
| 2007/0111386 A1 | 5/2007 | Kim et al. |
| 2007/0123061 A1 | 5/2007 | Evertsen et al. |
| 2007/0158024 A1 | 7/2007 | Addison et al. |
| 2007/0222048 A1 | 9/2007 | Huang |
| 2007/0295456 A1 | 12/2007 | Gudeman et al. |
| 2008/0036082 A1 | 2/2008 | Eun |
| 2008/0165521 A1* | 7/2008 | Bernstein ........... H01L 21/6835 |
| | | 438/109 |
| 2008/0265421 A1 | 10/2008 | Brunnbauer et al. |
| 2009/0029274 A1 | 1/2009 | Olson et al. |
| 2009/0068831 A1 | 3/2009 | Enquist et al. |
| 2009/0095399 A1 | 4/2009 | Zussy et al. |
| 2009/0149023 A1 | 6/2009 | Koyanagi |
| 2009/0227089 A1 | 9/2009 | Plaut et al. |
| 2009/0252939 A1 | 10/2009 | Park et al. |
| 2009/0283898 A1 | 11/2009 | Janzen et al. |
| 2010/0123268 A1 | 5/2010 | Menard |
| 2011/0042814 A1 | 2/2011 | Okuyama |
| 2011/0049696 A1* | 3/2011 | Haba ............... H01L 24/96 |
| | | 257/E25.027 |
| 2011/0074033 A1 | 3/2011 | Kaltalioglu et al. |
| 2011/0186977 A1 | 8/2011 | Chi et al. |
| 2011/0290552 A1 | 12/2011 | Palmateer et al. |
| 2012/0003792 A1 | 1/2012 | Cheah et al. |
| 2012/0025396 A1 | 2/2012 | Liao et al. |
| 2012/0049344 A1 | 3/2012 | Pagaila et al. |
| 2012/0077314 A1 | 3/2012 | Park et al. |
| 2012/0190187 A1* | 7/2012 | Yang ............... H01L 24/03 |
| | | 438/618 |
| 2012/0212384 A1 | 8/2012 | Kam et al. |
| 2012/0217644 A1 | 8/2012 | Pagaila |
| 2012/0238070 A1 | 9/2012 | Libbert et al. |
| 2013/0037962 A1 | 2/2013 | Xue |
| 2013/0082399 A1 | 4/2013 | Kim et al. |
| 2013/0122655 A1 | 5/2013 | Yu et al. |
| 2013/0169355 A1 | 7/2013 | Chen et al. |
| 2013/0299997 A1 | 11/2013 | Sadaka |
| 2013/0334697 A1 | 12/2013 | Shin et al. |
| 2014/0013606 A1 | 1/2014 | Nah et al. |
| 2014/0154839 A1 | 6/2014 | Ahn et al. |
| 2014/0175655 A1* | 6/2014 | Chen ............... H01L 24/11 |
| | | 228/172 |
| 2014/0187040 A1 | 7/2014 | Enquist et al. |
| 2014/0225795 A1 | 8/2014 | Yu |
| 2014/0299981 A1 | 10/2014 | Goh et al. |
| 2014/0312511 A1 | 10/2014 | Nakamura |
| 2014/0327150 A1 | 11/2014 | Jung et al. |
| 2014/0370658 A1 | 12/2014 | Tong et al. |
| 2014/0377909 A1 | 12/2014 | Chung et al. |
| 2015/0021754 A1 | 1/2015 | Lin et al. |
| 2015/0048500 A1 | 2/2015 | Yu et al. |
| 2015/0064498 A1 | 3/2015 | Tong |
| 2015/0097022 A1* | 4/2015 | Di Cioccio ............. H01L 24/06 |
| | | 228/173.6 |
| 2015/0102468 A1 | 4/2015 | Kang et al. |
| 2015/0130082 A1 | 5/2015 | Lu et al. |
| 2015/0162294 A1* | 6/2015 | Kawasaki ............... H01L 24/19 |
| | | 257/773 |
| 2015/0179481 A1 | 6/2015 | Lin |
| 2015/0206865 A1 | 7/2015 | Yu et al. |
| 2015/0235949 A1 | 8/2015 | Yu et al. |
| 2015/0270209 A1 | 9/2015 | Woychik et al. |
| 2015/0303174 A1 | 10/2015 | Yu et al. |
| 2015/0340285 A1 | 11/2015 | Enquest et al. |
| 2016/0035687 A1* | 2/2016 | Lin ............... H01L 24/16 |
| | | 257/737 |
| 2016/0071770 A1 | 3/2016 | Albermann et al. |
| 2016/0093592 A1* | 3/2016 | Zhai ............... H01L 28/10 |
| | | 438/107 |
| 2016/0141267 A1* | 5/2016 | Hagimoto ......... H01L 21/76849 |
| | | 438/98 |
| 2016/0155724 A1 | 6/2016 | Kim et al. |
| 2016/0190103 A1 | 6/2016 | Kabe et al. |
| 2016/0233175 A1 | 8/2016 | Dubey et al. |
| 2016/0300817 A1 | 10/2016 | Do et al. |
| 2016/0343682 A1* | 11/2016 | Kawasaki ............... H01L 24/82 |
| 2016/0372323 A1 | 12/2016 | Doub et al. |
| 2017/0023405 A1 | 1/2017 | Fahim et al. |
| 2017/0148764 A1 | 5/2017 | Wang et al. |
| 2017/0179029 A1* | 6/2017 | Enquist ............... H01L 23/5283 |
| 2017/0194271 A1 | 7/2017 | Hsu et al. |
| 2017/0200659 A1 | 7/2017 | Gaynes et al. |
| 2017/0200711 A1 | 7/2017 | Uzoh et al. |
| 2017/0200756 A1 | 7/2017 | Kao et al. |
| 2017/0250161 A1 | 8/2017 | Haba |
| 2017/0358533 A1* | 12/2017 | Briggs ............... H01L 21/76849 |
| 2017/0358553 A1 | 12/2017 | Kim et al. |
| 2017/0365591 A1 | 12/2017 | Chang et al. |
| 2018/0005992 A1 | 1/2018 | Yu et al. |
| 2018/0006006 A1 | 1/2018 | Kim et al. |
| 2018/0012787 A1 | 1/2018 | Oka et al. |
| 2018/0012863 A1 | 1/2018 | Yu et al. |
| 2018/0053746 A1 | 2/2018 | Yu et al. |
| 2018/0068958 A1 | 3/2018 | Cho et al. |
| 2018/0096931 A1 | 4/2018 | Huang et al. |
| 2018/0122774 A1 | 5/2018 | Huang et al. |
| 2018/0130769 A1 | 5/2018 | Tan et al. |
| 2018/0158749 A1 | 6/2018 | Yu et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0366436 A1* | 12/2018 | Wang ............... H01L 23/3114 |
| 2018/0366442 A1 | 12/2018 | Gu et al. |
| 2018/0366446 A1 | 12/2018 | Haba et al. |
| 2019/0096741 A1 | 3/2019 | Uzoh et al. |
| 2019/0096842 A1 | 3/2019 | Fountain, Jr. et al. |
| 2019/0103409 A1 | 4/2019 | Xu et al. |
| 2019/0115277 A1 | 4/2019 | Yu et al. |
| 2019/0131277 A1 | 5/2019 | Yang et al. |

(56) References Cited

U.S. PATENT DOCUMENTS

| | | |
|---|---|---|
| 2019/0157333 A1* | 5/2019 | Tsai ................. H01L 23/5226 |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0319007 A1* | 10/2019 | Uzoh .................... H01L 24/08 |
| 2019/0333550 A1 | 10/2019 | Fisch |
| 2019/0333871 A1 | 10/2019 | Chen et al. |
| 2019/0341306 A1 | 11/2019 | Yu et al. |
| 2019/0348336 A1 | 11/2019 | Katkar et al. |
| 2019/0355706 A1 | 11/2019 | Enquist et al. |
| 2019/0371763 A1 | 12/2019 | Agarwal et al. |
| 2019/0385935 A1 | 12/2019 | Gao et al. |
| 2019/0385966 A1* | 12/2019 | Gao .................... H01L 24/08 |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0051953 A1 | 2/2020 | Kurita |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0098736 A1* | 3/2020 | Liao ................. H01L 23/5226 |
| 2020/0106156 A1* | 4/2020 | Lu ........................ H01L 24/19 |
| 2020/0118973 A1 | 4/2020 | Wang et al. |
| 2020/0126906 A1 | 4/2020 | Uzoh et al. |
| 2020/0176419 A1 | 6/2020 | Dabral et al. |
| 2020/0194396 A1 | 6/2020 | Uzoh |
| 2020/0227367 A1* | 7/2020 | Haba ..................... H01L 24/94 |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0057242 A1 | 2/2021 | Tang et al. |
| 2021/0057309 A1* | 2/2021 | Hu ........................ H01L 25/50 |
| 2021/0060798 A1 | 3/2021 | Jeong et al. |
| 2021/0104487 A1 | 4/2021 | Uzoh et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0183847 A1 | 6/2021 | Uzoh et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0233889 A1 | 7/2021 | Mandalapu et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0020729 A1 | 1/2022 | Gao et al. |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0189941 A1 | 6/2022 | Enquist et al. |
| 2022/0199560 A1 | 6/2022 | Haba et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0293567 A1 | 9/2022 | Uzoh et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0130580 A1 | 4/2023 | Uzoh et al. |
| 2023/0131849 A1 | 4/2023 | Uzoh et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |

FOREIGN PATENT DOCUMENTS

| | | |
|---|---|---|
| EP | 2 339 614 A1 | 6/2011 |
| EP | 2 685 491 A2 | 1/2014 |
| EP | 3 483 925 A1 | 5/2019 |
| JP | 04-337694 | 11/1992 |
| JP | 2000-100679 | 4/2000 |
| JP | 2001-102479 | 4/2001 |
| JP | 2002-353416 | 12/2002 |
| JP | 2004-193493 | 7/2004 |
| JP | 2009-135348 | 6/2009 |
| JP | 2010-073964 | 4/2010 |
| JP | 2011-171614 | 9/2011 |
| JP | 2013-33786 | 2/2013 |
| JP | 2018-160519 | 10/2018 |
| KR | 10-2001-0104643 | 11/2001 |
| KR | 10-2004-0020827 | 3/2004 |
| KR | 10-2010-0123755 | 11/2010 |
| KR | 10-2015-0097798 | 8/2015 |
| WO | WO 2005/043584 A2 | 5/2005 |
| WO | WO 2006/100444 A1 | 9/2006 |
| WO | WO 2009/005898 A1 | 1/2009 |
| WO | WO 2010/024678 A1 | 3/2010 |
| WO | WO 2014/052445 A1 | 4/2014 |
| WO | WO 2015/134227 A1 | 9/2015 |
| WO | WO 2017/034654 A1 | 3/2017 |
| WO | WO 2017/052652 A1 | 3/2017 |
| WO | WO 2017/151442 A1 | 9/2017 |

OTHER PUBLICATIONS

Amirfeiz et al., "Formation of silicon structures by plasma-activated wafer bonding," Journal of The Electrochemical Society, 2000, vol. 147, No. 7, pp. 2693-2698.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding

(56) References Cited

OTHER PUBLICATIONS method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Fukushima, T. et al., "New three-dimensional integration technology using self-assembly technique," International Electron Devices Meeting Dec. 5-7, 2005, IEEE, Dec. 5, 2005, pp. 348-351.
Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion mailed Apr. 17, 2017, issued in International Application No. PCT/US2016/068577, 16 pages.
International Search Report and Written Opinion mailed Sep. 22, 2017, issued in International Application No. PCT/US2017/029187, 20 pages.
International Search Report and Written Opinion mailed Mar. 7, 2019, in International Application No. PCT/US2018/060044, 14 pages.
International Search Report and Written Opinion mailed Apr. 22, 2019 in International Application No. PCT/US2018/064982, 13 pages.
International Search Report and Written Opinion mailed Oct. 25, 2019, issued in International Application No. PCT/US2019/040622, 12 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu-Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Confererence, 2001, 51st Proceedings, IEEE, pp. 384-387.
Moriceau, H. et al., "Overview of recent direct wafer bonding advances and applications," Advances in Natural Sciences-Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.

(56) References Cited

OTHER PUBLICATIONS

Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Uhrmann, T. et al., "Heterogeneous integration by collective die-to-wafer bonding," Chip Scale Review, Nov./Dec. 2018, vol. 22, No. 6, pp. 10-12.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, July/Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Chang, T.C. et al., "A method for fabricating a superior oxide/nitride/oxide gate stack," Electrochemical and Solid-State Letters, 2004, vol. 7, No. 7, pp. G138-G140.
"Die-to-Wafer Fusion and Hybrid Bonding," EV Group, https://www.evgroup.com/technologies/die-to-wafer-fusion-and-hybrid-bonding/, printed Sep. 21, 2022, 8 pages.
Gao, G. et al., "Low temperature hybrid bonding for die to wafer stacking applications," 2021 IEEE 71st Electronic Components and Technology Conference (ECTC), IEEE, Jun. 1, 2021-Jul. 4, 2021.
Hooper, A. et al. "Review of wafer dicing techniques for via-middle process 3DI/TSV ultrathin silicon device wafers," 2015 IEEE 65th Electronic Components and Technology Conference (ECTC).
Jin, H. et al., "Silicon / Silicon Oxide / LPCVD Silicon Nitride Stacks: The Effect of Oxide Thickness on Bulk Damage and Surface Passivation," Centre for Sustainable Energy Systems, Faculty of Engineering and Information Technology, The Australian National University, Canberra ACT 0200, Australia, 3 pages.
"Lecture 29: Productivity and process yield," National Programme on Technology Enhanced Learning (NPTEL), MM5017: Electronic materials, devices, and fabrication, 16 pages.
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
ONSEMI AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "ONSEMI AR0820.".
Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".
"The effects of edge trimming—Engineering R&D Division, Operation V," Disco Technical Review Mar. 2016, 3 pages.

* cited by examiner

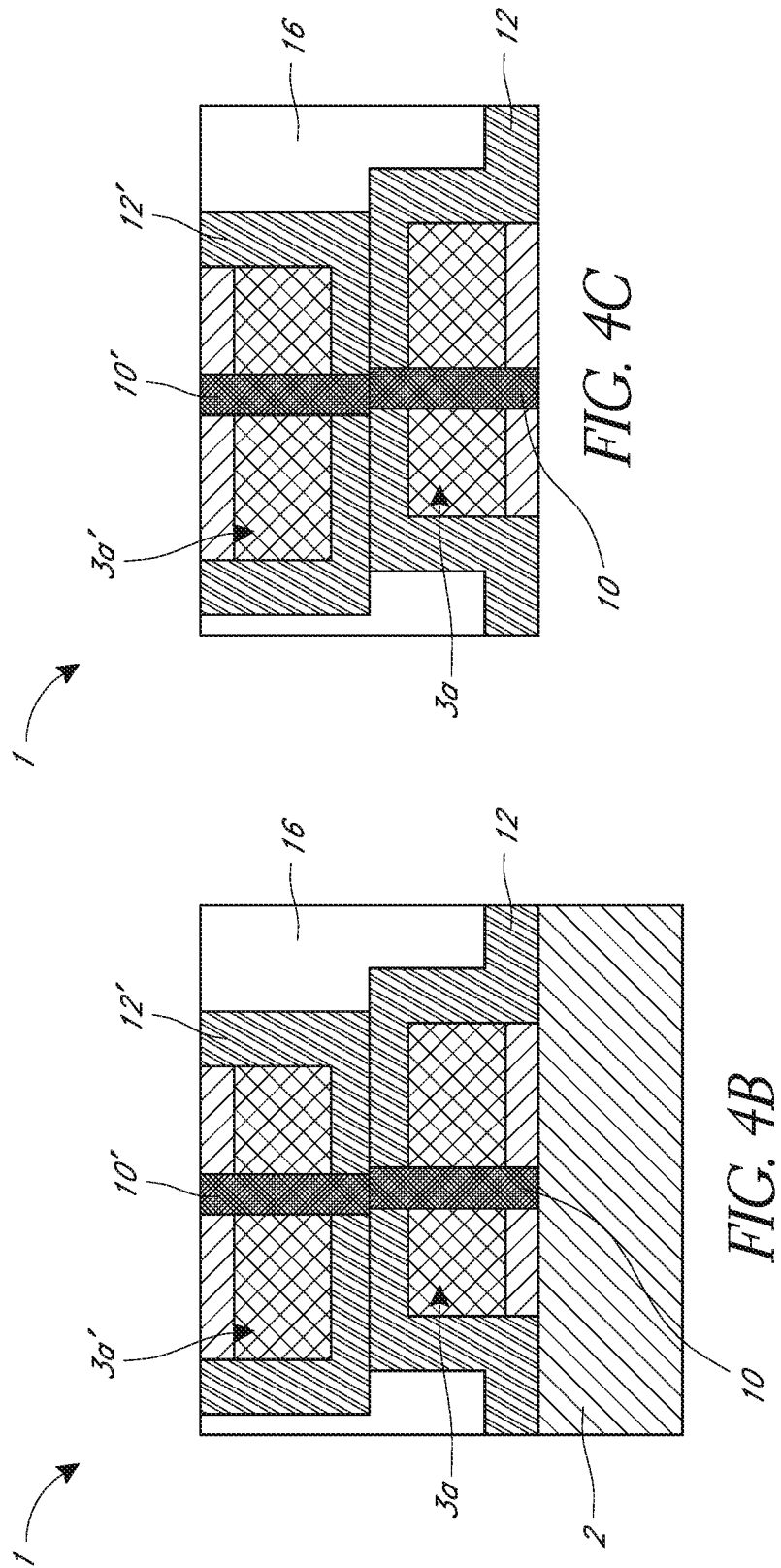

DIRECT GANG BONDING METHODS INCLUDING DIRECTLY BONDING FIRST ELEMENT TO SECOND ELEMENT TO FORM BONDED STRUCTURE WITHOUT ADHESIVE

CROSS-REFERENCE TO RELATED APPLICATIONS

This application claims priority to U.S. Provisional Patent Application No. 62/906,608, filed Sep. 26, 2019, the entire contents of which are incorporated by reference in their entirety and for all purposes.

BACKGROUND

Field of the Invention

The field relates to direct gang bonding methods and structures.

Description of the Related Art

In various packaging arrangements, it can be advantageous to enable the use of multiple integrated device dies within a low-profile package. For example, three-dimensional (3D) integration techniques often utilize packages in which two or more integrated device dies are stacked on top of and electrically connected to one another. Conventional methods for die thinning and/or 3D integration may have limited product yield because stresses imparted to the dies during assembly may damage dies in the stack. Moreover, it can be challenging to stack dies which have different thicknesses and which have high pin counts and which may originate from different types of substrates and/or wafers. Accordingly, there remains a continuing need for improved systems and methods for stacking integrated device dies.

BRIEF DESCRIPTION OF THE DRAWINGS

These aspects and others will be apparent from the following description of preferred embodiments and the accompanying drawing, which is meant to illustrate and not to limit the invention, wherein:

FIG. 1E' is another example of FIG. 1E according to one embodiment.

FIG. 1F' is another example of FIG. 1F according to one embodiment.

FIGS. 4A-4D illustrate examples of bonded structures according to various embodiments.

DETAILED DESCRIPTION

Some methods of stacking integrated device dies can mount multiple first dies to a tape structure and stack second dies onto the first dies that are disposed on the tape structure. However, the use of a tape structure to support the first dies may inadequately secure the first dies to the tape structure. Moreover, in some methods, the stacked dies can be overmolded or otherwise processed into a reconstituted wafer for subsequent processing. Overmolding or other steps in the reconstitution process may induce stresses on the integrated device dies, may be costly, and/or may utilize a thick layer of low coefficient of thermal expansion (CTE) material which may be difficult to manufacture. Accordingly, there remains a continuing need for improved stacking of elements such as integrated device dies.

Various embodiments disclosed herein relate to direct gang bonding methods and structures. For example, in various embodiments, a first plurality of elements can be simultaneously directly bonded to a second plurality of elements without intervening adhesives. Prior to and during direct bonding, adjacent elements on a carrier may be spaced apart by a gap that is not filled with a filling material. The lack of a filling material during direct bonding can reduce thermal stresses that may occur if a filling material were used between adjacent elements and can also simplify the deposition process. In various embodiments, a dielectric layer can be conformally deposited over upper and side surfaces of the elements. After bonding, outer side surfaces of the dielectric layers of two bonded elements may be laterally offset relative to one another.

Figure 1A:
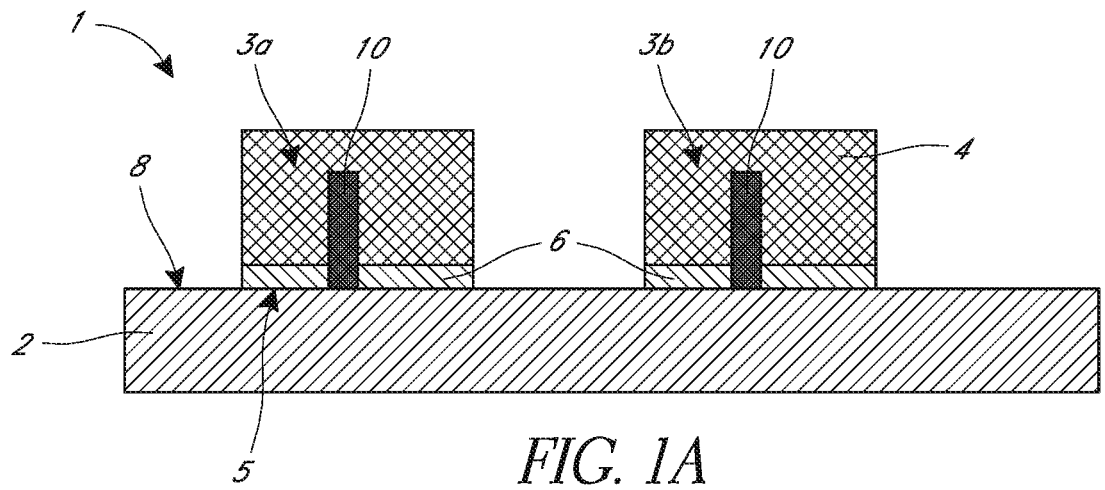
FIGS. 1A-1G are schematic side cross-sectional views of various stages of a direct bonding process, according to one embodiment.

FIGS. 1A-1G are schematic side cross-sectional views of various stages of a method for preparing elements 3a, 3b for forming a bonded structure 1, according to one embodiment. In FIG. 1A, a first plurality of elements 3a, 3b can be mounted to an upper surface 8 of a carrier 2. In the illustrated embodiment, the elements 3a, 3b can be directly bonded to the upper surface 8 of the carrier 2 without an intervening adhesive. The carrier 2 can comprise for example, a substrate (e.g., a semiconductor substrate), an interposer, a wafer, a reconstituted wafer, or any other suitable type of carrier. In some embodiments, the carrier 2 can comprise a silicon substrate (e.g., part or all of a wafer), a glass substrate, or silicon on insulator (SOI) substrate or planar dielectric surface 8. The use of silicon, glass, or other semiconductor material for the carrier 2 can advantageously enable the upper surface 8 of the carrier 2 to be polished to a very low surface roughness so that the first elements 3a, 3b can be directly bonded to the carrier 2. In the illustrated embodiment, for example, the carrier 2 can comprise a silicon carrier with a dielectric surface, for example, an oxide layer formed on the upper surface 8. The dielectric surface or the oxide layer can be formed in any suitable manner, for example, by thermal oxidation, Plasma Enhanced Chemical Vapor Deposition (PECVD), chemical oxidation, sputtering, evaporation, atomic layer deposition (ALD), etc.

The elements 3a, 3b can comprise any suitable type of element, such as a semiconductor element. In various embodiments, the elements 3a, 3b can comprise integrated device dies (e.g., integrated circuit, dies, memory dies, microelectromechanical systems dies, sensor dies, etc.). As shown the elements 3a, 3b can include an active surface or region 6 that is patterned with active devices, such as electronic devices like transistors. One or a plurality of interconnects or vias 10 can extend through a portion of the elements 3a, 3b shown in FIG. 1A. In the step of FIG. 1A, the vias 10 can extend from a bottom surface 5 of the active region 6 into a bulk portion 4 (e.g., bulk silicon portion) of the elements 3a, 3b. The vias 10 can be connected to contact pads on the bottom surface 5 of the elements 3a, 3b that are directly bonded to corresponding contact or bond pads on the upper surface 8 of the carrier 2. The elements 3a, 3b may comprise the same type of element or different types of elements in various embodiments.

To accomplish the direct bonding, in some embodiments, the bonding surfaces of the elements 3a, 3b and the carrier 2 can be prepared for bonding. The elements 3a, 3b can be polished to a very high degree of smoothness (e.g., less than 20 nm surface roughness, less than 1 nm surface roughness, or more particularly, less than 0.5 nm roughness). In some embodiments, a bonding layer (not shown) (e.g., a dielectric such as silicon oxide) may be deposited on the active surfaces 6 of the elements 3a, 3b and polished to a very high degree of smoothness. Similarly, the bonding surface of the carrier 2 (e.g., the upper surface 8 of the carrier 2) may be polished to a very high degree of smoothness (e.g., less than 20 nm surface roughness, less than 1 nm surface roughness, or more particularly, less than 0.5 nm roughness). In some embodiments, the bonding surfaces may be fluorinated to improve bonding energy or strength between the bonding surface of the carrier 2 and the mating or bonding surfaces of elements 3a and 3b. The bonding surfaces may also include conductive features, such as conductive bond or contact pads, conductive traces or conductive dummy features. In some embodiments, the surfaces to be bonded may be terminated with a suitable species and activated prior to bonding. For example, in some embodiments, the surfaces to be bonded may be very lightly etched for activation and exposed to a nitrogen-containing solution and terminated with a nitrogen-containing species. As one example, the surfaces to be bonded may be exposed to an ammonia dip after a very slight etch, and/or a nitrogen-containing plasma (with or without a separate etch).

Once the surfaces are prepared, nonconductive field regions of the elements 3a, 3b can be brought into contact with corresponding nonconductive field regions of the carrier 2. The interaction of the activated surfaces can cause the nonconductive regions of the elements 3a, 3b to directly bond with the corresponding nonconductive regions of the carrier 2 without an intervening adhesive, without application of external pressure, without application of voltage, and about room temperature. In various embodiments, the bonding strength of the nonconductive regions can be covalent bonds that are greater than Van der Waals bonds. In various embodiments, the nonconductive regions are initially bonded at about room temperature. In some embodiments, covalent bonding can occur during a natural anneal at about room temperature or during a heated anneal. In some embodiments, the interconnects or vias 10 and/or the contact pads are flush or slightly recessed relative to the exterior surfaces of the elements 3a, 3b and the carrier 2. In other embodiments, one of the interconnects 10 and/or the contact pads may extend above the exterior surfaces of the elements 3a, 3b and the carrier 2. In still other embodiments, the interconnects 10 and/or the contact pads are recessed relative to the exterior surfaces (e.g., oxide field regions) of the elements 3a, 3b and the carrier 2. Depending on the depth and width of the conductive features 10, the recess may range between 1 to 40 nm. The bonded structure 1 can be annealed after the nonconductive regions are bonded to create contact and a direct bond between opposing conductive regions (e.g., between opposing contact pads) without an intervening adhesive. The bonded structure 1 can be annealed after the nonconductive regions are bonded to create contact and a direct bond between opposing conductive regions (e.g., between opposing contact pads) without an intervening adhesive. In various embodiments, the carrier 2 and elements 3a, 3b may be heated after bonding to strengthen the bonds between the nonconductive regions, between the conductive regions, and/or between opposing conductive and non-conductive regions, to cause the elements 3a, 3b to bond with the carrier 2. Additional details of the direct bonding processes may be found throughout U.S. Pat. Nos. 7,126,212; 8,153,505; 7,622,324; 7,602,070; 8,163,373; 8,389,378; 8,735,219; 9,953,941; and 10,204,893, and throughout U.S. Patent Publication No. US 2017/0200711, the contents of each of which are hereby incorporated by reference herein in their entirety and for all purposes.

Figure 1B:
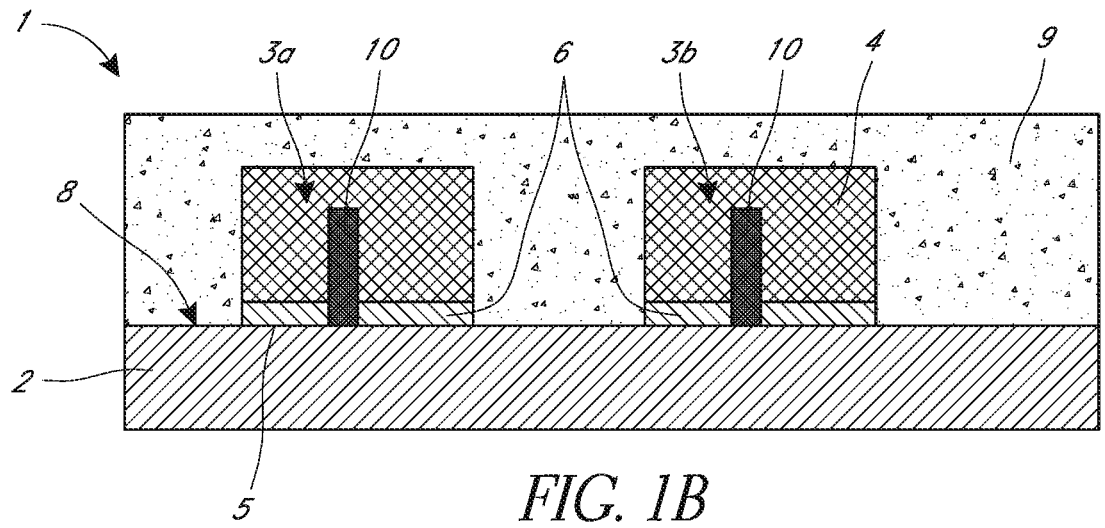
Figure 1C:
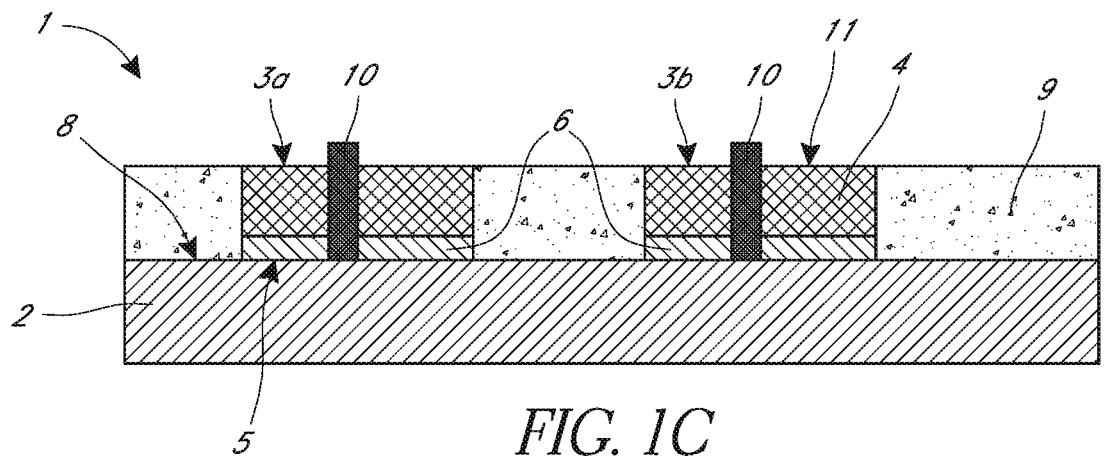

Turning to FIG. 1B, a sacrificial filler material 9 can be provided over the elements 3a, 3b and the upper surface 8 of the carrier 2, and filling the space between the elements 3a, 3b. The sacrificial filler material 9 can comprise any suitable type of temporary or sacrificial material that can be removed by way of subsequent processing. For example, in various embodiments, the sacrificial material 9 can comprise a photoresist material, such as a hard baked photoresist, a spin on polymer coating, an adhesive film, polyimide, etc. In FIG. 1C, the partially-formed structure 1 can be thinned. For example, a portion of the sacrificial material 9 and a portion of the elements 3a, 3b can be selectively removed to thin the structure 1. For example, an upper surface of the sacrificial material 9 can be grinded, polished, dry etched with a plasma process, or wet etched with a chemical to expose upper sides of the elements 3a, 3b. In various embodiments, grinding and chemical mechanical polishing (CMP) can be used to remove the upper portion of the sacrificial filler material 9 and upper portions of the elements 3a, 3b. The portions of the upper sides of the elements 3a, 3b can also be removed to expose the interconnects or vias 10 at an exposed upper surface 11 of bulk portions 4 of the elements 3a, 3b. As illustrated in FIG. 1C, a portion of the interconnects 10 can protrude from a surface of the bulk portions 4. In some arrangements, the sacrificial filler material 9 may facilitate planarization of the exposed surfaces 11 of the elements 3a, 3b while reducing stresses on the corners of elements 3a, 3b.

Figure 1D:
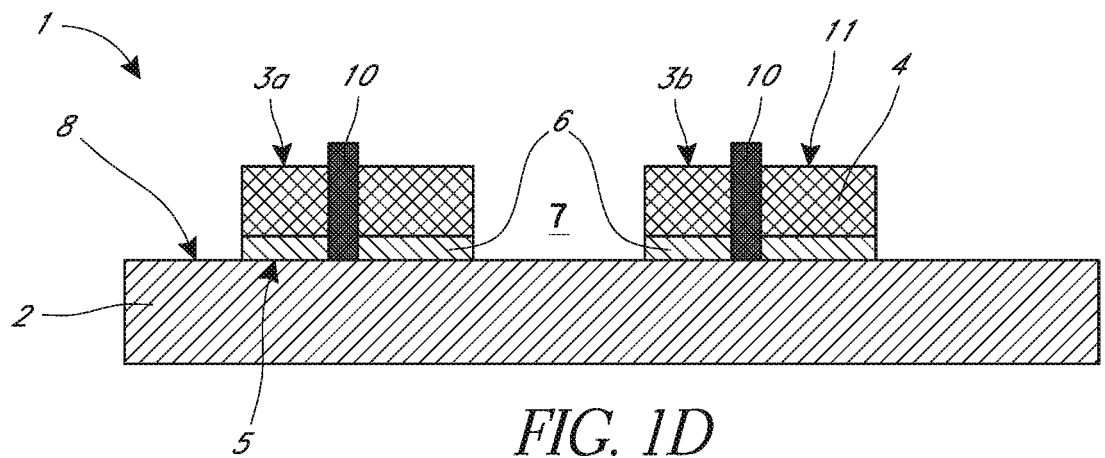
Figure 1E:
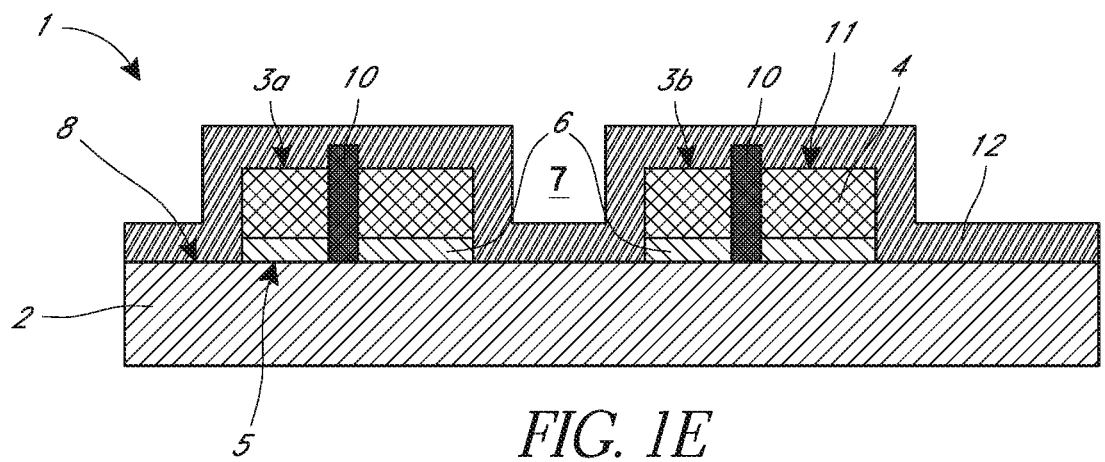
Figure 1E:
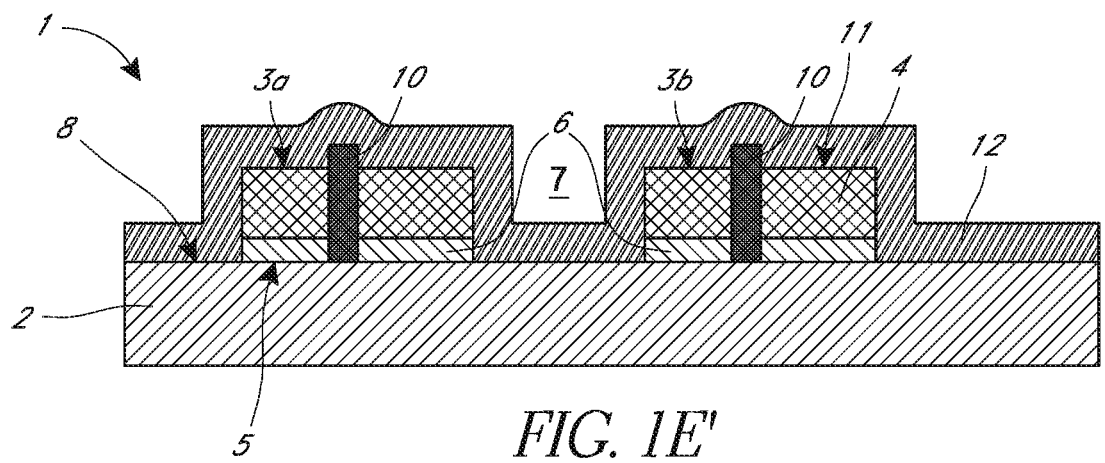

In FIG. 1D, the sacrificial filler material 9 can be removed such that no filler material is disposed over or between the elements 3a, 3b. For example, the sacrificial filler material 9 can be removed by a wet or dry etching process, a plasma etching process, a stripping process, etc. In arrangements in which there is no sacrificial material, the upper corners or edges between the horizontal and vertical portions of element 3a and 3b may crack or chip off if gentle pressures are not utilized during the thinning and polishing of the backsides of element 3a and 3b. In FIG. 1D, the elements 3a, 3b can be separated by a gap 7. The gap 7 may not include a filling material, for example, the gap 7 may be filled with a gas (such as air) or may be under vacuum. Turning to FIG. 1E, a dielectric material comprising a dielectric layer 12 can be deposited over the elements 3a, 3b and over portions of the upper surface 8 of the carrier 2 disposed between adjacent elements 3a, 3b. In some embodiments, the dielectric layer 12 may comprise a conformal dielectric coating, as illustrated in FIG. 1E'. For example, a portion of the dielectric layer 12 above the protruded via 10 can be higher than area surrounding the portion. In some applications, the thickness of the dielectric layer 12 is smaller than the thickness of elements 3a or 3b. The dielectric layer 12 can serve as a protective material to protect the upper and side surfaces of the elements 3a, 3b. The dielectric layer 12 can also be selected to serve as a nonconductive bonding layer or region for subsequent direct bonding steps. The dielectric layer 12 can comprise any suitable type of dielectric material. For example, in various embodiments, the dielectric layer 12 can comprise silicon oxide, silicon nitride, silicon oxynitride, silicon carbide, or any other suitable dielectric. In some embodiments, the dielectric layer 12 may comprise multiple layers of different dielectric materials. At the edge of the die, the dielectric layer 12 can cover debris or cracks weakly bonded due to die singulation and which might negatively impact the bond. As shown the gap 7 can be disposed between portions of the dielectric layer 12 disposed on sidewalls of adjacent elements 3a, 3b.

Figure 1F:
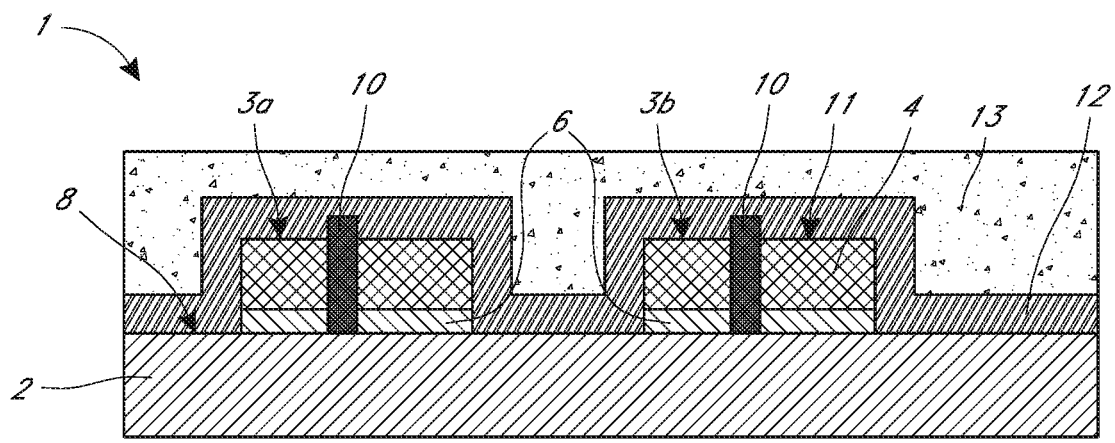
Figure 1F:
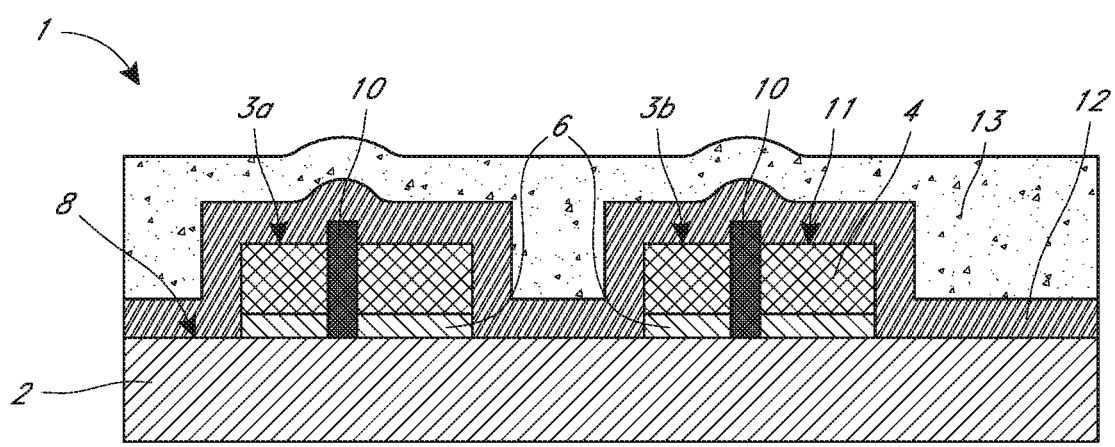
Figure 1G:
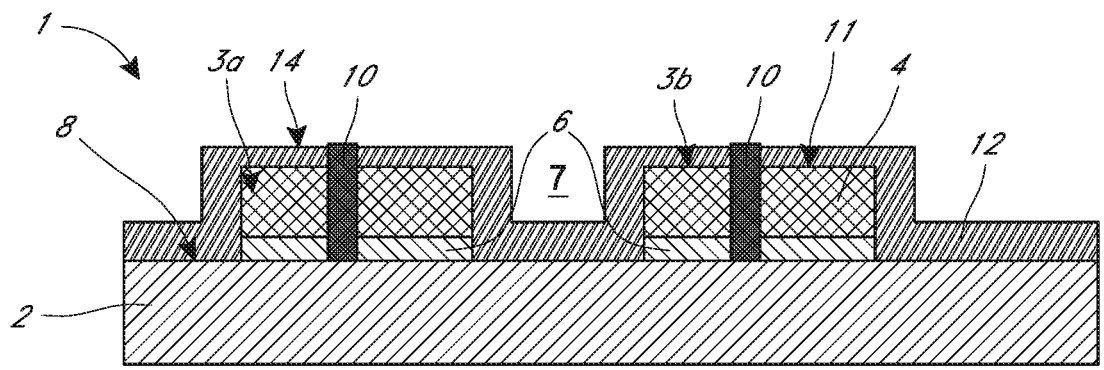

A second sacrificial filler material 13 can be provided over the dielectric layer 12 including the gaps 7 in FIG. 1F. In some embodiments, the second sacrificial layer 13 may comprise a dielectric coating, as illustrated in FIG. 1F'. As with the sacrificial filler material 9, the second sacrificial filler material 13 can facilitate thinning of the partially-formed bonded structure 1. Turning to FIG. 1G, the partially-formed bonded structure 1 can be thinned. For example, an upper portion of the second sacrificial filler material 13 and upper portions of the dielectric layer 12 can be selectively removed, for example, by polishing, grinding, etc. In some embodiments, the second sacrificial material 13 can be then completely removed. As shown in FIG. 1G, only a portion of the dielectric layer 12 can be removed, so as to expose the vias 10 at an exposed upper portion 14 of the dielectric layer 12.

Figure 2A:
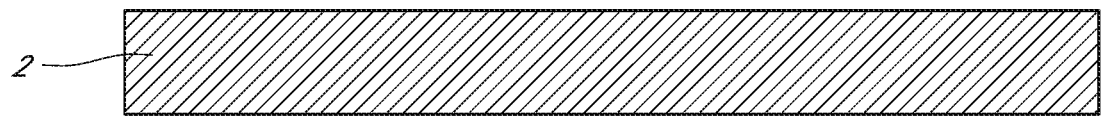
FIGS. 2A-2E are schematic side cross-sectional views of various stages of a direct bonding process, according to another embodiment.
Figure 2B:
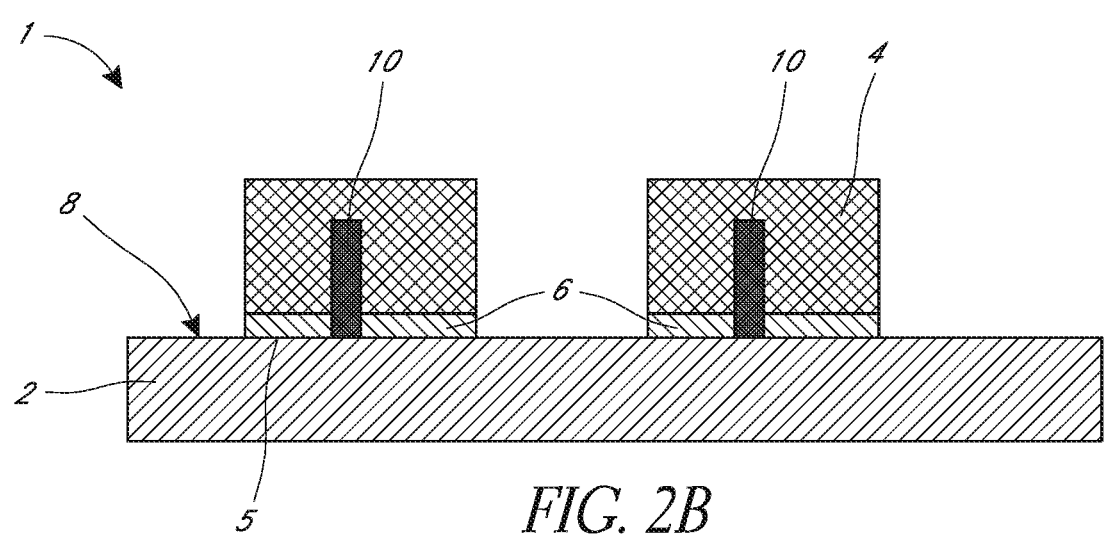
Figure 2C:
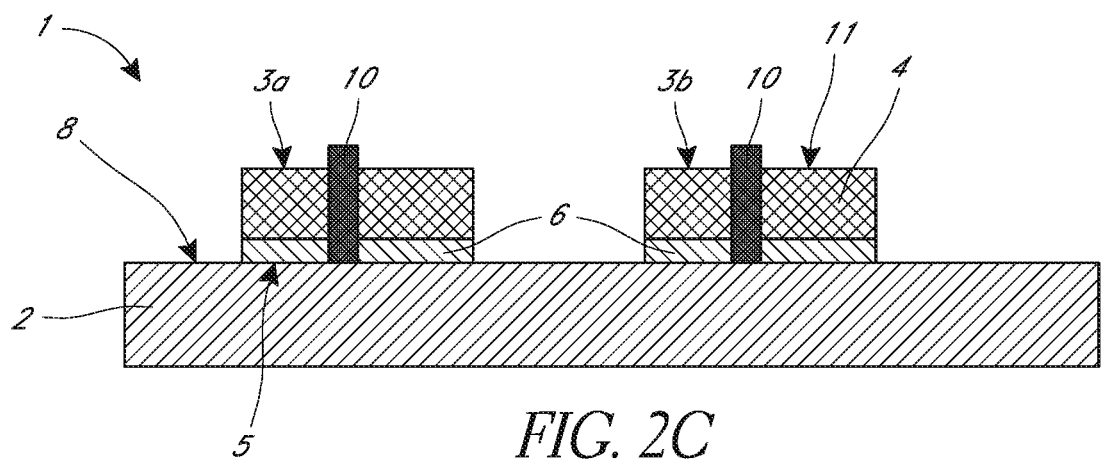
Figure 2D:
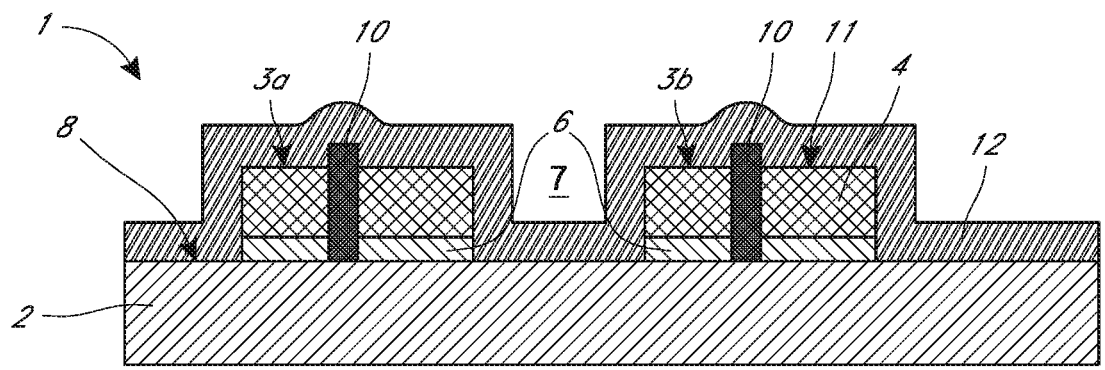
Figure 2E:
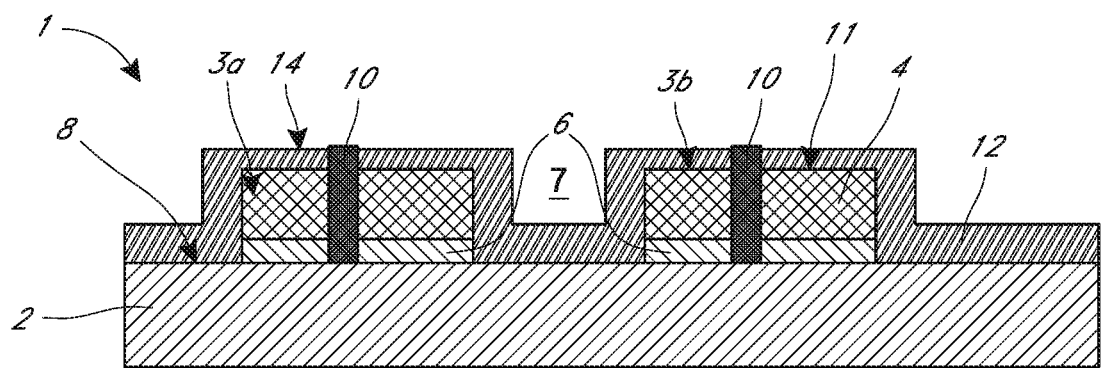

FIGS. 2A-2E are schematic side cross-sectional views of various stages of a method for forming a preliminary bonded structure 1, according to another embodiment. Unless otherwise noted, the components of FIGS. 2A-2E may be the same as or generally similar to like-numbered components of FIGS. 1A-1G. In FIG. 2A, a carrier 2 can be provided. As shown in FIG. 2B, as with FIG. 1A, elements 3a, 3b can be directly bonded to the carrier 2 without an intervening adhesive. Moving to FIG. 2C, the preliminary bonded structure 1 can be thinned, for example, upper surfaces of the elements 3a, 3b, for example the bulk portion 4, can be selectively removed (e.g., by grinding, polishing, dry etched with a plasma process, or wet etched with a chemical) without providing a sacrificial filler material over and between the elements 3a, 3b. Thus, in some embodiments, the elements 3a, 3b can be planarized to expose the vias 10 at exposed surface 11 without using a sacrificial filler material. As illustrated in FIG. 2C, a portion of the vias 10 can protrude from the exposed surface 11. As with FIG. 1E or 1E', the dielectric layer 12 can be provided over the elements 3a, 3b in FIG. 2D. An upper portion of the dielectric layer 12 can be removed (for example, by polishing, grinding, etc.) to expose the vias 10 at the exposed upper portion 14 of the dielectric layer 12. As with the embodiment of FIGS. 1A-1G, once the vias 10 are exposed, a gap 7 may be provided between the elements 3a, 3b as shown in FIG. 2E.

Figure 3A:
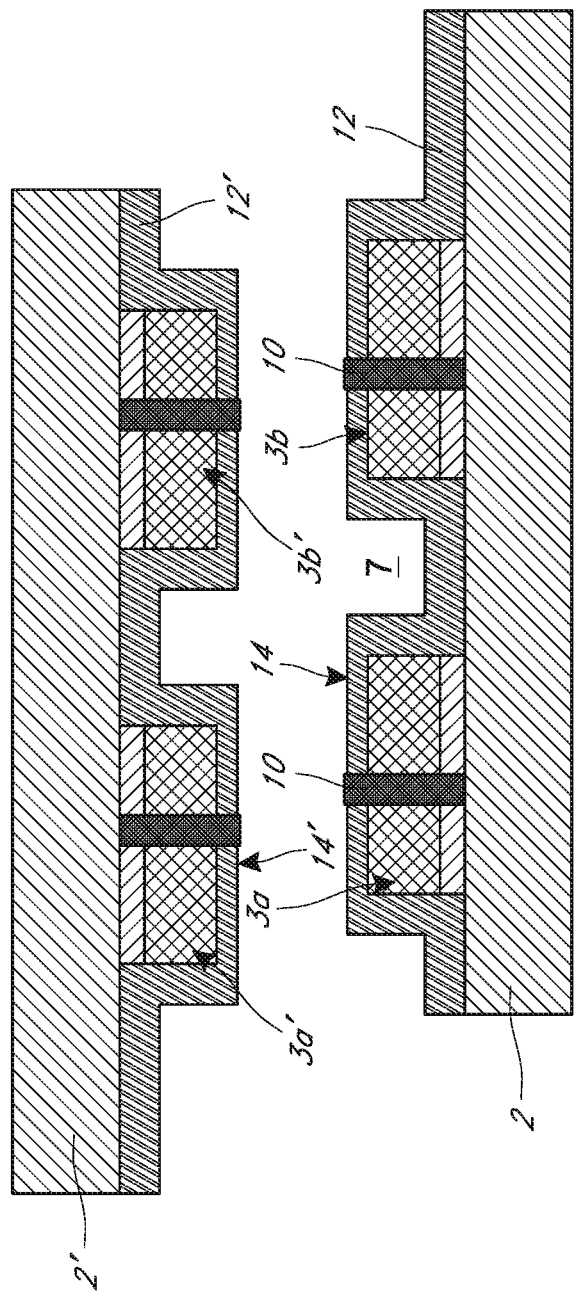
FIGS. 3A-3C illustrate various stages of a direct gang bonding process in which elements are directly bonded to one another without intervening adhesives.
Figure 3B:
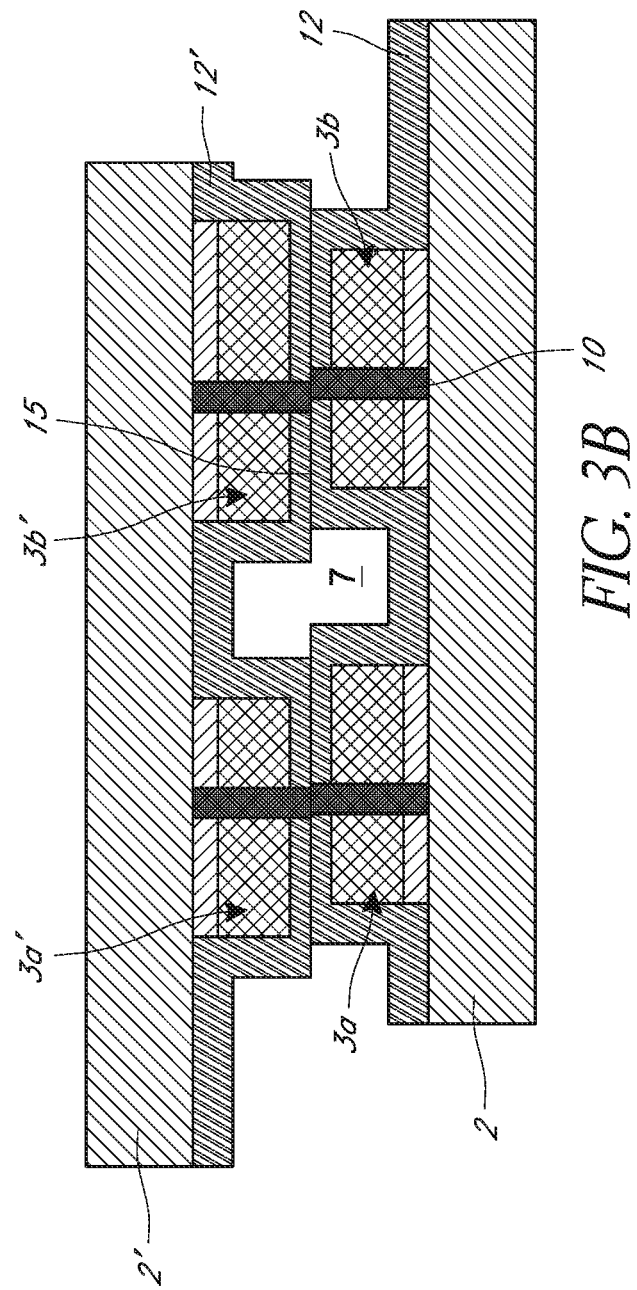
Figure 3C:
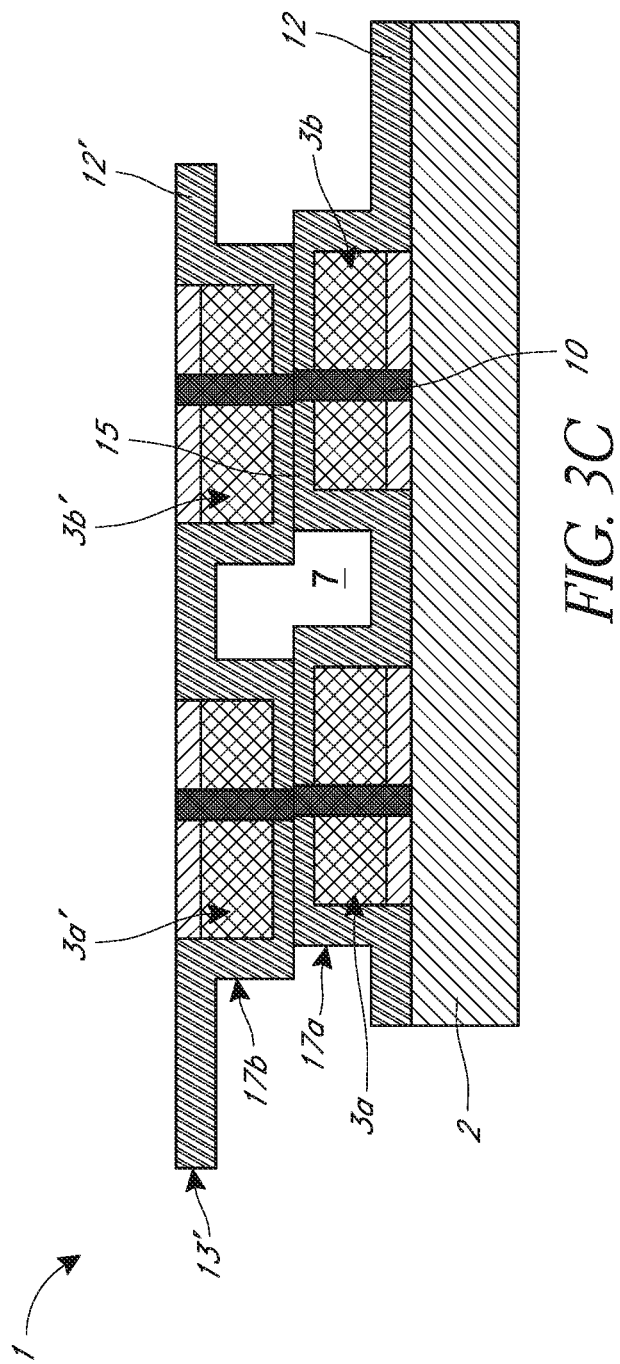

FIGS. 3A-3C illustrate various stages of a direct gang bonding process in which a first plurality of elements 3a, 3b is direct bonded to a corresponding second plurality of elements 3a', 3b' without intervening adhesives. In some embodiments, the bonding process illustrated in FIGS. 3A-3C can be used for a wafer to wafer bonding process, in which each wafer includes numerous elements to be directly bonded. Unless otherwise noted, components of FIGS. 3A-3C may be the same as or generally similar to like-numbered components of FIGS. 1A-2D. For example, in FIG. 3A, the exposed upper surfaces 14, 14' of the dielectric layers 12, 12' of the elements 3a, 3b, 3a', 3b' can be prepared for direct bonding as explained above in connection with FIG. 1A. In various embodiments, the processes described in connection with FIGS. 1G and 2E may be used to at least partially prepare the surfaces of the dielectric layer 12 for bonding. Additional processing may be performed to prepare the dielectric layer 12 and the contact pads connected to the exposed portion of the vias 10 for direct bonding. For example, in some embodiments, the surfaces 14, 14' to be bonded may be very lightly etched for activation and exposed to a nitrogen-containing solution and terminated with a nitrogen-containing species. For example, oxygen reactive ion etching plasma and nitrogen radical activation may be used. As another example, the surfaces 14, 14' to be bonded may be exposed to an ammonia dip after a very slight etch, and/or a nitrogen-containing plasma (with or without a separate etch). Further, in some embodiments, a pre-process for direct bonding may be performed. For example, the pre-process may include a surface cleaning process such as a vacuum ultraviolet irradiation, a vacuum ultraviolet/ozone irradiation, sulfuric-peroxide mixture (SPM) cleaning process, etc.

In FIG. 3B, the elements 3a' and 3b' may be simultaneously brought into direct contact with the elements 3a, 3b. For example, once the surfaces 14, 14' are prepared, nonconductive field regions of the elements 3a, 3b can be brought into contact with each other. The interaction of the activated surfaces can cause the nonconductive regions of the elements 3a, 3b to directly bond with the corresponding nonconductive regions of the elements 3a, 3b without an intervening adhesive, without application of external pressure, without application of voltage, and about room temperature. In various embodiments, the bonding strength of the nonconductive regions can be covalent bonds that are greater than Van der Waals bonds. In some embodiments, covalent bonding can occur between the surfaces 14, 14'. The bonded structure 1 can be annealed after directly bonding the surfaces 14, 14'.

In some embodiments, the structure of FIG. 3B can be annealed at elevated temperature to enhance the bond strength of the non-conductive area around via 10 and to form direct metal-to-metal bonding of the vias 10 (or contact pads connected to the vias 10). Thus, in FIG. 3B, the element 3a' can be directly bonded to the element 3a along a bond interface 15 without an intervening adhesive. The element 3b' can be directly bonded to the element 3b along a bond interface 15 without an intervening adhesive. In some embodiments, the same or a generally similar method of directly bonding the elements 3a, 3b and the carrier 2 can be used for bonding the elements 3a', 3b' and the elements 3a, 3b, respectively.

As shown, prior to and during direct bonding of the elements 3a, 3a', 3b, 3b', the elements 3a, 3b (and also the elements 3a', 3b') may occlude the gap 7 in which no filling material is disposed. Rather, as shown in FIGS. 3A-3B, the gap 7 may be filled with a gas (such as air) or under vacuum. Beneficially, the absence of filling material during bonding can reduce stresses on the elements 3a, 3b that may be introduced during heating due to different coefficients of thermal expansion (CTE) of the filling material(s) and may reduce the number of process steps, thus lowering fabrication costs.

Turning to FIG. 3C, the carrier 2' to which the elements 3a', 3b' are bonded may be removed. As shown in FIG. 3C, the elements 3a, 3a' and 3b, 3b' may be slightly laterally offset relative to one another, due to, for example, inaccuracies in the alignment process. The carrier 2' can be removed in any suitable manner, for example, by etching, grinding, polishing, etc. In some embodiments, the carrier 2 to which the elements 3a, 3b are bonded may also be removed. As shown in FIG. 3C, the dielectric layer 12' on the element 3a' can define a first outer surface 17a, and the dielectric layer 12 on the element 3b can define a second outer surface 17b. In some embodiments, the bonded structure 1 of FIG. 3C can be integrated into the larger electronic system, for example, by mounting the bonded structure 1 to a system or motherboard. In some embodiments, therefore, the first and second outer surfaces 17a, 17b can be exposed on an exterior surface of the bonded structure 1. As shown in FIG. 3C, an overhanging portion 13' of the dielectric layer 12' can remain after the removal of the carrier 2', and can overhang the bonded structure. As shown in FIGS. 5B-5C, the overhanging portion of the dielectric layer 12 may break off during subsequent processing.

Figure 4A:
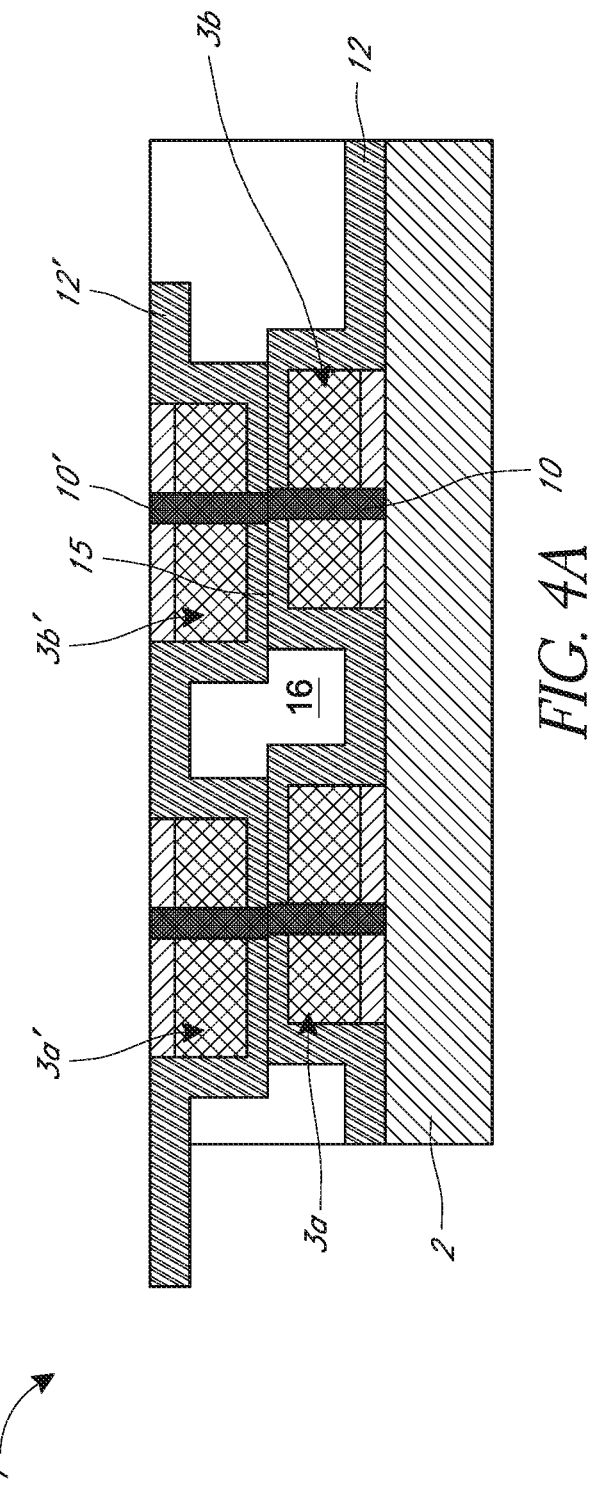

FIGS. 4A-4D illustrate examples of bonded structures 1 during various stages of a stacking process. Unless otherwise noted, components of FIGS. 4A-4D may be the same as or generally similar to like-numbered components of FIGS. 1A-3C. In some embodiments, the same or a generally similar method of directly bonding the elements 3a, 3b associated with FIGS. 1A-3C can be used. In FIG. 4A, for example, the gap 7 between the elements 3a, 3a', 3b, 3b' produced in FIG. 3C can be filled with a filling material 16, such as a molding compound. The filling material 16 can protect the elements 3a, 3a', 3b, 3b' during a subsequent process or during operation. The filling material 16 can be applied within the gaps disposed between adjacent stacked structures. For example, the filling material 16 can be applied in a flowable form, and can be hardened by/after curing. The filling material 16 can be applied after the elements 3a, 3a' and the elements 3b, 3b' are direct bonded, such that the filling material 16 can comprise a seamless filler. For example, the filling material 16 can comprise a single layer of filler. In other embodiments, however, no filling material can be applied, and the bonded structure 1 of FIG. 3C can be integrated into the larger electronic system.

As shown in FIG. 4B, the bonded structure 1 of FIG. 4A can be singulated along saw lines between the elements 3a, 3b and between the elements 3a', 3b' to form a singulated bonded structure 1. Thus, in the singulated bonded structure 1 of FIG. 4B, the filling material 16 can be disposed along the side surfaces of the singulated bonded structure 1. The filling material 16 can comprise markings indicative of a sawing process or other methods such as laser stealth dicing or laser ablation used during singulation. The carrier 2 may remain bonded to the elements 3a, 3b for integration into the larger electronic system or device in some embodiments. For example, the carrier 2 can be bonded (e.g., direct bonded or adhered with an adhesive such as solder) to a motherboard of the larger electronic system. In other embodiments, as shown in FIG. 4C, the carrier 2 can be removed such that the elements 3a, 3b and/or 3a', 3b' can be bonded to the motherboard of the larger electronic system.

Figure 4D:
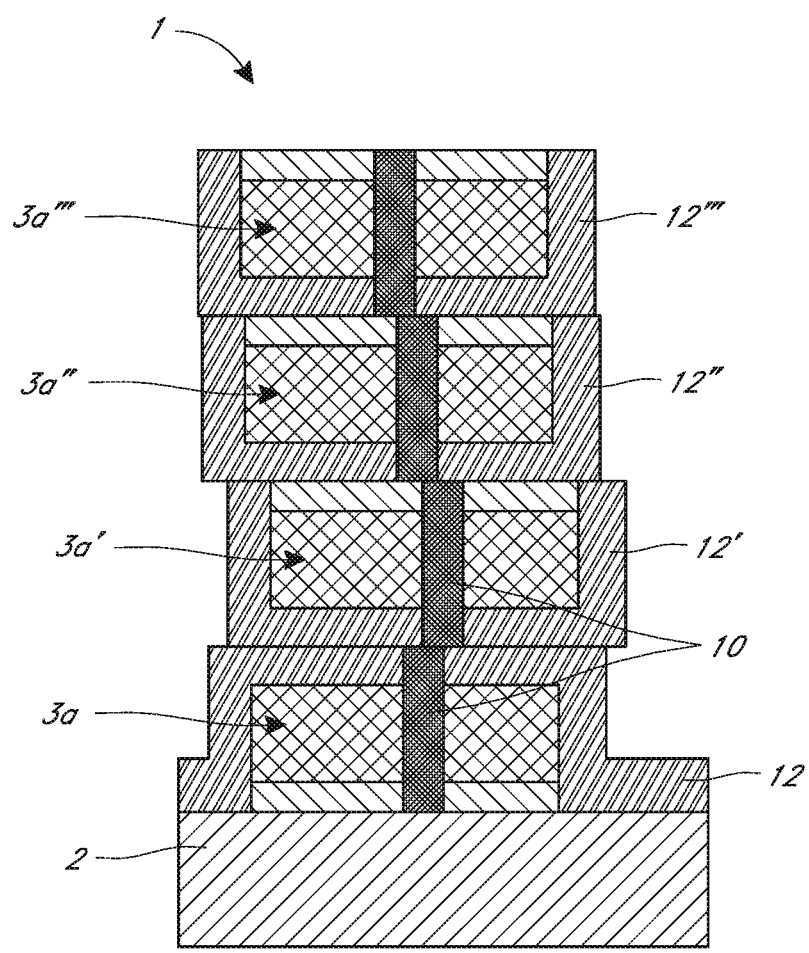

FIG. 4D illustrates a bonded structure 1 in which more than two elements are bonded together to form a stacked bonded structure. For example, in FIG. 4D, element 3a'' can be directly bonded to element 3a', and element 3a''' can be directly bonded to element 3a''. The interconnects or vias 10 can provide vertical electrical communication among the elements 3a-3a'''. Although four elements 3a-3a''' are shown in FIG. 4D, in other embodiments, more or fewer than four elements can be provided. In the embodiment of FIG. 4D, the outer side surfaces defined at least in part by the dielectric layers 12, 12', 12'', 12''' can be exposed on the exterior surface of the bonded structure 1. In other embodiments, as with FIGS. 4A-4C, a filling material can be provided between the bonded structures such that, in FIG. 4D, the filling material can be disposed alongside surfaces of the dielectric layers 12, 12', 12'', 12'''.

Figure 5A:
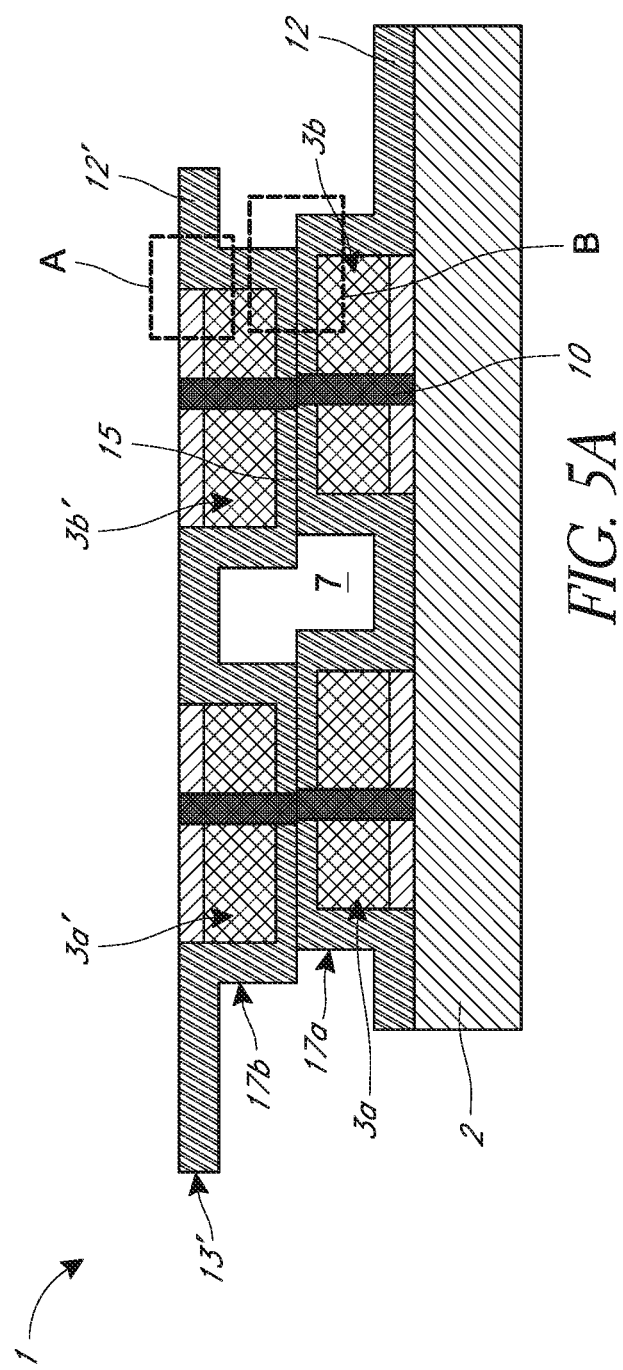
FIG. 5A illustrates schematic side cross-sectional views of a bonded structure according to various embodiments.
Figure 5B:
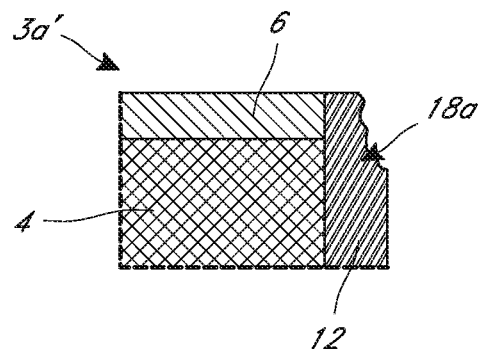
FIGS. 5B-5D illustrate enlarged views of a portion of the bonded structure of FIG. 5A.
Figure 5C:
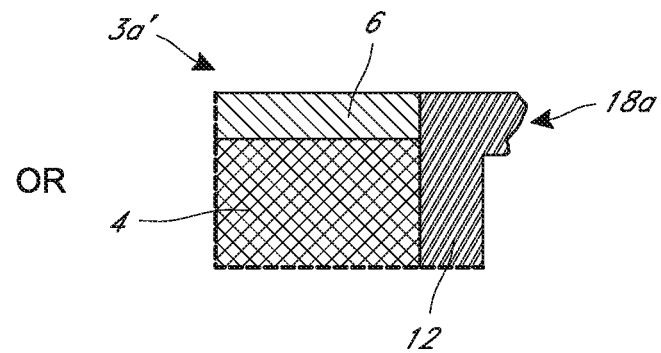
Figure 5D:
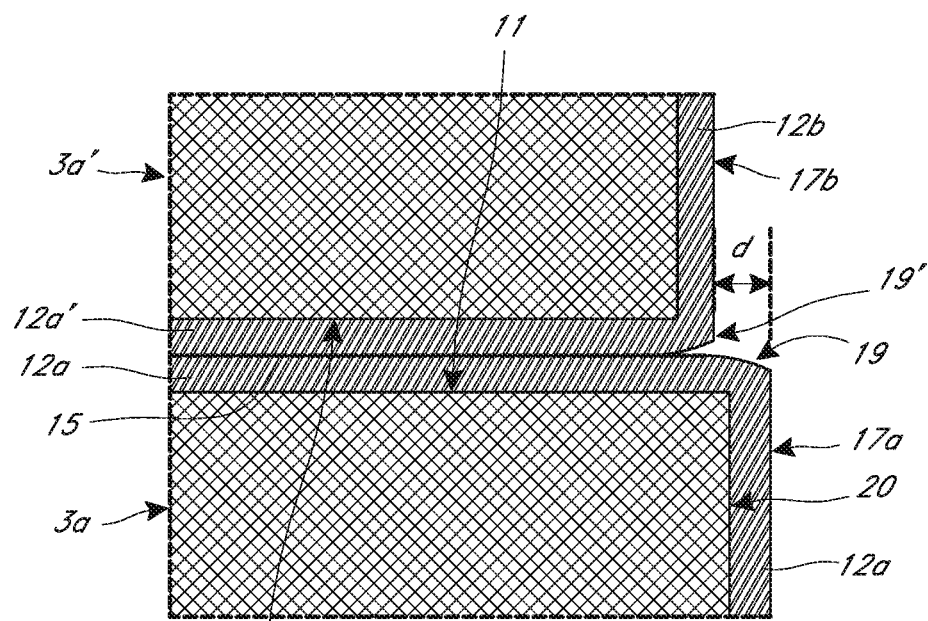

FIG. 5A illustrates a bonded structure 1 prior to singulation. FIGS. 5B-5D illustrate magnified portions of the bonded structure 1 of FIG. 5A. Unless otherwise noted, components of FIGS. 5A-5D may be the same as or generally similar to like-numbered components of FIGS. 1A-4D. As explained above, in various embodiments, one or both carriers 2, 2' can be removed from the bonded structure. For example, the carrier(s) 2 and/or 2' can be removed by etching, grinding, polishing, or any other suitable removal method. When the carrier 2' is separated from the dielectric layer 12', a portion of the dielectric layer 12' can fracture or break away from the carrier 2'. The breaking away of the carrier 2' from the dielectric layer 12' can form a fractured surface (or structure) 18a or 18b in the dielectric layer 12'. For example, as shown in FIG. 5B, in some cases, the fractured surface 18a can comprise a concave surface in which a portion of the dielectric material 12' along side surfaces 20 of the element 3a' is removed. In other cases, as shown in FIG. 5C, a fractured surface 18b can comprise a concave surface or projection that extends outwardly from the side of the bonded structure 1. As shown in FIGS. 5B and 5C, the fractured surface (or structure) 18a or 18b can be disposed at a portion of the dielectric layer 12' at or near a surface of the element 3a' opposite the bonding interface 15 between the elements 3a, 3a'. In some embodiments, when the carrier 2' is separated from the dielectric layer 12', an interface where the element 3a' and the dielectric layer 12' meet can fracture or break away from the carrier 2' (not illustrated). Still in some embodiments portions dielectric layer 12' abutting carrier 2' may be selectively removed (not illustrated) prior to the bond of the horizontal surface of elements 3a and 3b to the respective counterparts 3a' and 3b'. The selective removal of selected portions of dielectric layer 12' from the surface of carrier 2' reduces the incidence of fractures of FIGS. 5B and 5C during the removal of carrier 2'.

Turning to FIG. 5D, as explained above, the dielectric layers 12, 12' can coat (e.g., conformally coat in some embodiments) side surfaces 20 of the elements 3a, 3a' and the exposed upper surfaces 11, 11' of the respective elements 3a, 3a'. For example, as shown in FIG. 5D, upper portions 12a' of the dielectric layers 12' can be provided over the exposed upper surfaces 11, 11' of the respective elements 3a, 3a'. The upper portion 12a of the dielectric layer 12 on the element 3a can be directly bonded without an intervening adhesive to the corresponding upper portion 12a' of the dielectric layer 12' on the element 3a'. Further, as shown in FIG. 5D, the dielectric layers 12, 12' can be rounded or curved along curved surfaces 19, 19' that are disposed between the side surfaces 20, 20' and the upper surfaces 11, 11' of the elements 3a, 3a'. For example, the first dielectric layers 12, 12' is curved along an edge or corner of the first and the second element 3a, 3a' between the first and second bonding surfaces and the at least one first and second side surface. As explained above, the elements 3a, 3a' may be slightly misaligned such that, after direct bonding, side surfaces 20, 20' of the elements 3a, 3a' and outer surfaces 17a, 17b of the dielectric layers 12, 12' are laterally offset relative to one another by an offset distance d. The offset distance d can be less than 2 µm, less than 5 µm, or less than 10 µm, for example, in a range of 0.2 µm to 10 µm, in a range of 0.2 µm to 5 µm, in a range of 0.2 µm to 2 µm, or in a range of 0.2 µm to 1 µm. In various embodiments the offset distance d can be less than the width of the via 10 or other contact pads which are connected to one another (which as explained above can result from misalignment between the top and bottom elements or dies). In various embodiments, for example, the offset distance d can be substantially smaller than a width of the contact pads or vias 10. For example, the offset distance d can be less than 95% of the width of contact pads or vias 10, or less than 60% of the width of contact pads or vias 10. The offset distance d may be sufficiently small such that contact pads connected to the interconnects 10 maintain direct contact after bonding. In some embodiment, the offset distance d is less than 5% of the thickness of the elements 3a or 3b, for example, less than 10% of the thickness of the elements 3a, 3b.

Figure 6:
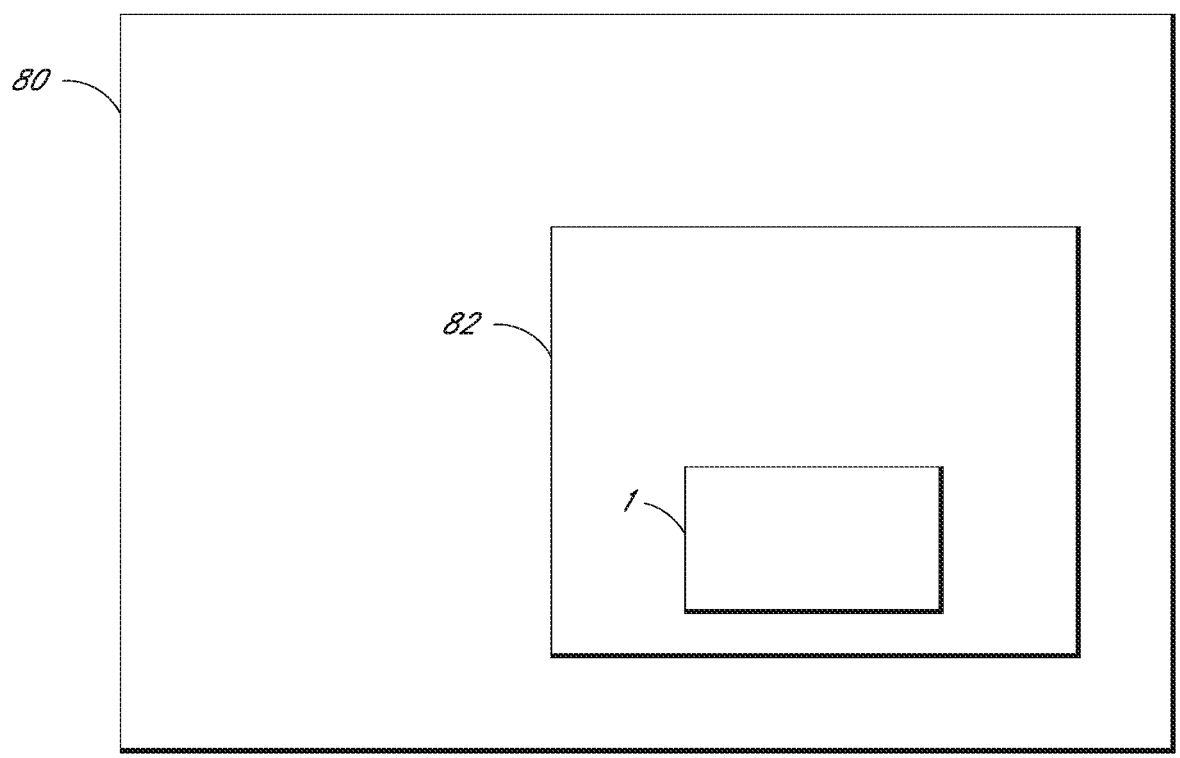
FIG. 6 is a schematic diagram of a system incorporating one or more bonded structures according to various embodiments.

FIG. 6 is a schematic diagram of a system 80 incorporating one or more bonded structures 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic device can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 1. The bonded structures 1 shown in FIG. 6 can comprise any of the bonded structures 1 shown and described above in connection with FIGS. 1A-5D. The bonded structure 1 can include one or more integrated device dies which perform various functions for the system 80.

For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A method of forming a bonded structure, the method comprising:
    forming a first dielectric layer on a first element and on a third element, the first dielectric layer being formed on an upper surface and a side surface of each of the first and the third elements;
    forming a second dielectric layer on a second element and on a fourth element, the second dielectric layer being formed on an upper surface and a side surface of each of the second and fourth elements;
    polishing a surface of the first dielectric layer; and
    directly bonding the polished surface of a first portion of the first dielectric layer that is disposed on the first element to a first portion of the second dielectric layer that is disposed on the second element to form a first bonded structure without an adhesive, and directly bonding the polished surface of a second portion of the first dielectric layer that is disposed on the third element to a second portion of the second dielectric layer that is disposed on the fourth element to form a second bonded structure without an adhesive, wherein the first bonded structure is spaced from the second bonded structure by a gap.

2. The method of claim 1, wherein before forming the first dielectric layer, directly bonding the first element and the third element to a first carrier without an intervening adhesive and directly bonding the second element and the fourth element to the second carrier without an intervening adhesive.

3. The method of claim 2, further comprising, after directly bonding the polished surface of the first portion of the first dielectric layer to the first portion of the second dielectric layer and the polished surface of the second portion of the first dielectric layer to the second portion of the second dielectric layer, removing the first carrier from the first element and the third element.

4. The method of claim 1, further comprising, after directly bonding the first portion of the first dielectric layer to the first portion of the second dielectric layer and the second portion of the first dielectric layer to the second portion of the second dielectric layer, providing a filling material in the gap between the first and second bonded structures.

5. The method of claim 1, further comprising, after directly bonding the first portion of the first dielectric layer to the first portion of the second dielectric layer and the second portion of the first dielectric layer to the second portion of the second dielectric layer, singulating the bonded structure along the gap to physically separate the first and second bonded structures.

6. The method of claim 1, wherein directly bonding the polished surface of the first portion of the first dielectric layer to the first portion of the second dielectric layer comprises directly hybrid bonding the polished surface of the first portion of the first dielectric layer to the first portion of the second dielectric layer, and wherein directly bonding the polished surface of the second portion of the first dielectric layer to the second portion of the second dielectric layer comprises directly hybrid bonding the polished surface of the second portion of the first dielectric layer to the second portion of the second dielectric layer.

7. The method of claim 1, wherein the gap is filled with a gas or under vacuum.

8. The method of claim 1, further comprising providing a filling material in the gap.

9. A method of forming a bonded structure, the method comprising:
forming a first dielectric layer on a first element and on a third element, a first portion of the first dielectric layer being formed on an upper surface of each of the first and third elements and a second portion of the first dielectric layer being formed on a side surface of each of the first and the third elements;
forming a second dielectric layer on a second element and on a fourth element, a first portion of the second dielectric layer being formed on an upper surface of each of the second and fourth elements and a second portion of the second dielectric layer being formed on a side surface of each of the second and fourth elements;
thinning the first element and the third element to expose a conductive via in the first element and the third element; and
after the thinning, directly bonding the first portion of the first dielectric layer to the first portion of the second dielectric layer to form a first bonded structure, and directly bonding the second portion of the first dielectric layer to the second portion of the second dielectric layer to form a second bonded structure without an adhesive, wherein the first bonded structure is spaced from the second bonded structure by a gap.

10. The method of claim 9, further comprising, before directly bonding the first portion of the first dielectric layer to the first portion of the second dielectric layer and the second portion of the first dielectric layer to the second portion of the second dielectric layer, forming the first dielectric layer and the second dielectric layer as a conformal layer.

11. The method of claim 10, further comprising removing a portion of the first dielectric layer to expose the conductive via through the first dielectric layer.

12. The method of claim 11, further comprising:
before directly bonding the first portion of the first dielectric layer to the first portion of the second dielectric layer and the second portion of the first dielectric layer to the second portion of the second dielectric layer, and after the thinning, providing a sacrificial material over the first dielectric layer; and
removing the sacrificial material after the removing the portion of the first dielectric layer.

13. The method of claim 9, further comprising:
before directly bonding the first portion of the first dielectric layer to the first portion of the second dielectric layer and the second portion of the first dielectric layer to the second portion of the second dielectric layer, and before the thinning, providing a sacrificial material over the first and third elements; and
removing the sacrificial material after the thinning.

14. The method of claim 9, wherein directly bonding the first portion of the first dielectric layer to the first portion of the second dielectric layer and the second portion of the first dielectric layer to the second portion of the second dielectric layer comprises directly hybrid bonding the first portion of the first dielectric layer to the first portion of the second dielectric layer and the second portion of the first dielectric layer to the second portion of the second dielectric layer.

15. The method of claim 9, wherein the gap is filled with a gas or under vacuum.

16. The method of claim 9, further comprising providing a filling material in the gap.

17. A method of forming a bonded structure, the method comprising:
depositing a first dielectric layer over a first plurality of singulated elements mounted to a first carrier and spaced apart from one another by one or more respective first gaps, each of the first plurality of singulated elements comprises an integrated device die, the first dielectric layer being formed on an upper surface and at least a portion of a side surface of each of the first plurality of singulated elements;
depositing a second dielectric layer over a second plurality of singulated elements mounted to a second carrier and spaced apart from one another by one or more respective second gaps, the second dielectric layer being formed on an upper surface and at least a portion of a side surface of each of the second plurality of singulated elements; and
directly gang bonding the first dielectric layer without an adhesive to form a plurality of bonded structures, wherein adjacent bonded structures of the plurality of bonded structures are spaced apart by a gap.

18. The method of claim 17, further comprising directly bonding the first plurality of singulated elements to the first carrier without an adhesive and directly bonding the second plurality of singulated elements to the second carrier without an adhesive.

19. The method of claim 17, wherein the second plurality of singulated elements comprise integrated device dies.

20. The method of claim 17, wherein directly gang bonding the first dielectric layer to the second dielectric layer without an adhesive comprises directly hybrid bonding the first dielectric layer to the second dielectric layer.

21. The method of claim 17, wherein the one or more respective first gaps is filled with a gas or under vacuum and the one or more respective second gaps is filled with a gas or under vacuum.

22. The method of claim 17, further comprising providing a filling material in the gap.

23. A method of forming a bonded structure, the method comprising:
directly bonding first and third singulated elements to a first carrier without an intervening adhesive, at least the first singulated element comprises an integrated device die, the first and third singulated elements are spaced apart by a gap;
directly bonding second and fourth elements to a second carrier without an intervening adhesive;
while the first singulated element is directly bonded to the first carrier and the second element is directly bonded to the second carrier, directly bonding a first portion of a first dielectric layer disposed on the first singulated element to a first portion of a second dielectric layer disposed on the second element without an intervening adhesive; and
while the third singulated element is directly bonded to the first carrier and the fourth element is directly bonded to the second carrier, directly bonding a second portion of the first dielectric layer disposed on the third singulated element to a second portion of the second dielectric layer disposed on the fourth element without an intervening adhesive.

24. The method of claim 23, further comprising removing the second carrier after directly bonding the respective first portions and the respective second portions.

25. The method of claim 23, further comprising a gap between the second and fourth elements.

26. The method of claim 23, wherein
the second and fourth elements are singulated elements,
directly bonding the first portion of the first dielectric layer to the first portion of the second dielectric layer comprises directly hybrid bonding the first portion of the first dielectric layer to the first portion of the second dielectric layer; and
directly bonding the second portion of the first dielectric layer to the second portion of the second dielectric layer comprises directly hybrid bonding the second portion of the first dielectric layer to the second portion of the second dielectric layer.

27. The method of claim 23, wherein the gap is filled with a gas or under vacuum.

28. The method of claim 23, further comprising providing a filling material in the gap.

\* \* \* \* \*